US009859481B2

(12) United States Patent
Miki

(10) Patent No.: US 9,859,481 B2
(45) Date of Patent: Jan. 2, 2018

(54) LIGHT EMITTING DEVICE

(71) Applicant: NICHIA CORPORATION, Anan-shi, Tokushima (JP)

(72) Inventor: Tomohide Miki, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/973,878

(22) Filed: Dec. 18, 2015

(65) Prior Publication Data

US 2016/0181492 A1 Jun. 23, 2016

(30) Foreign Application Priority Data

Dec. 22, 2014 (JP) .................................. 2014-258806
Dec. 16, 2015 (JP) .................................. 2015-245023

(51) Int. Cl.
| | | |
|---|---|---|
| H01L 23/48 | (2006.01) | |
| H01L 21/00 | (2006.01) | |
| H01L 33/62 | (2010.01) | |
| H01L 33/48 | (2010.01) | |
| H01L 33/60 | (2010.01) | |

(52) U.S. Cl.
CPC ............ *H01L 33/62* (2013.01); *H01L 33/486* (2013.01); *H01L 33/60* (2013.01); *H01L 2224/48091* (2013.01); *H01L 2224/48247* (2013.01); *H01L 2224/48257* (2013.01); *H01L 2224/48465* (2013.01); *H01L 2924/181* (2013.01)

(58) Field of Classification Search
CPC ...................................................... H01L 27/30

USPC ...... 257/13, 79–103, 918, 40, 642–643, 759
See application file for complete search history.

(56) References Cited

U.S. PATENT DOCUMENTS

| | | | |
|---|---|---|---|
| 2012/0018772 A1 | 1/2012 | Nishijima et al. | |
| 2012/0168810 A1 | 7/2012 | Kobayashi et al. | |
| 2012/0313131 A1* | 12/2012 | Oda .................. | H01L 23/49503 257/98 |
| 2013/0099270 A1 | 4/2013 | Kobayashi et al. | |
| 2013/0256854 A1* | 10/2013 | Kobayashi ........ | H01L 23/49568 257/675 |
| 2013/0307000 A1* | 11/2013 | Ikenaga ................ | H01L 33/486 257/91 |

FOREIGN PATENT DOCUMENTS

| | | |
|---|---|---|
| JP | 2008-192837 A | 8/2008 |
| JP | 2011-071471 A | 4/2011 |
| JP | 2011-119557 A | 6/2011 |
| JP | 2011-134961 A | 7/2011 |

(Continued)

*Primary Examiner* — Moin Rahman
(74) *Attorney, Agent, or Firm* — Global IP Counselors, LLP

(57) ABSTRACT

A light emitting device includes: a package equipped with a lead that has an upper surface and a lower surface, and has a metal board and a plating layer formed on a surface of the metal board, the plating layer including a first plating layer provided to an upper surface of the metal board, and a second plating layer provided to a lower surface of the metal board, the first plating layer including nickel plating layer, gold plating layer and silver plating layer, and the second plating layer including no nickel plating layer and gold plating layer, and a molded resin that holds the lead; a light emitting element mounted in the package; and a sealing member that seals the light emitting element.

12 Claims, 3 Drawing Sheets

(56) References Cited

FOREIGN PATENT DOCUMENTS

| JP | 2012-028757 A | 2/2012 |
| JP | 2012-174966 A | 9/2012 |
| JP | 2014-029995 A | 2/2014 |

* cited by examiner

LIGHT EMITTING DEVICE

CROSS-REFERENCE TO RELATED APPLICATIONS

This application claims priority to Japanese Patent Applications No. 2014-258806 and No. 2015-245023 filed on Dec. 22, 2014 and Dec. 16, 2015. The entire disclosure of Japanese Patent Applications No. 2014-258806 and No. 2015-245023 is hereby incorporated herein by reference.

BACKGROUND

1. Field of the Invention

The present disclosure relates to a light emitting device.

2. Description of the Related Art

Among light emitting diodes (LEDs) and other such light emitting devices that make use of a semiconductor light emitting element (hereinafter referred to as a "light emitting element"), there are known devices that make use of a package made up of a resin and a lead. The base member of the lead is a metal board made of copper, iron, or the like, and the surface of which is plated.

The leads used in light emitting devices are often plated with a material having high reflectivity, such as silver. Plating layer with another material first as an underlayer is a known way to make it easier to form the silver plating layer on the surface of the metal board (for example, JP2011-71471A and JP2008-192837A).

SUMMARY

The light emitting device of the present disclosure includes a package, a light emitting element mounted in the package; and a sealing member that seals the light emitting element. The package is equipped with a lead and a molded resin that holds the lead. The lead has an upper surface and a lower surface, and has a metal board and a plating layer formed on a surface of the metal board. The plating layer includes a first plating layer provided to an upper surface of the metal board, and a second plating layer provided to a lower surface of the metal board, the first plating layer includes a nickel plating layer, a gold plating layer and a silver plating layer, and the second plating layer includes no nickel plating layer and gold plating layer.

According to the light emitting device of the present disclosure, it is possible to provide a light emitting device that makes use of a lead with which the cost is kept low while avoiding a decrease in reflectivity.

BRIEF DESCRIPTION OF DRAWINGS

FIG. 1A is a schematic cross sectional view illustrating a light emitting device according to an embodiment of the;

DETAILED DESCRIPTION OF THE EMBODIMENT

Figure 1A:
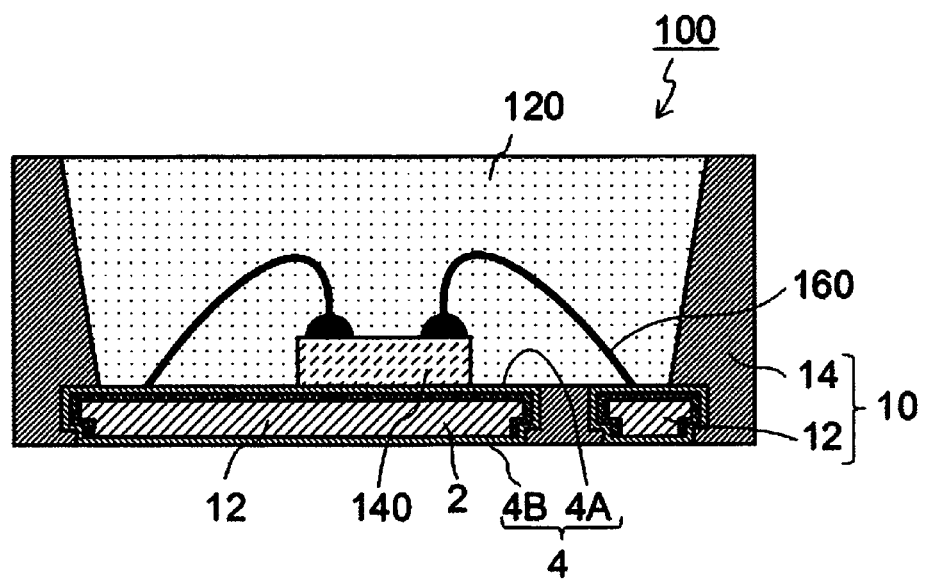

Embodiments for implementing the light emitting device of the present invention will be described below with reference to the accompanying drawings. In the following embodiment of the light emitting device that embody the technological concept of the present invention are just examples, and so forth of the constituent parts discussed in the embodiment are not intended to limit the scope of the present invention, and are merely examples given for the sake of illustration.

In the specification, the constituent of the present invention is not intended to limit the constituent parts discussed in the embodiments. In the following embodiment, however, that embody the technological concept of the present invention are just examples, and unless otherwise specified, the dimensions, materials, shapes, relative layout. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted.

The light emitting device includes a package, a light emitting element that is mounted in the package, and a sealing member that seals the light emitting element. The package includes a lead and a molded resin. The lead includes a metal board and a plating layer that is formed on the surface of the metal board. The plating layer has a first plating layer provided to the upper surface of the metal board, and a second plating layer provided to the lower surface of the metal board. The first plating layer contains nickel, gold, and silver. The second plating layer does not contain nickel or gold.

The upper surface of the lead is the surface on the side where the light emitting element is mounted, that is, the surface on the side where light from the light emitting element is emitted, and the light can be extracted more efficiently by the plating layer with silver, which has high reflectivity. The lower surface of the lead is the surface on the side where light from the light emitting element is not emitted, and does not need to be plated with highly reflective silver. Accordingly, the cost entailed by the plating layer can be lowered because the lower surface of the lead does not include an expensive material such as gold that is used as the underlayer for the silver.

Package

The package includes a lead and a molded resin that holds the lead. The package can have a flat shape, or it can have a shape in which a recess that allows the light emitting element to be mounted is provided, etc. With a flat package, the upper surface of the lead is exposed on the upper surface of the package. With a package having a recess, the upper surface of the lead is exposed on the bottom surface of the recess.

Lead

The lead functions as the electrodes of the light emitting device, and has at least two leads: a positive electrode lead and a negative electrode lead. The leads are flat metal members that have been patterned in a specific shape, and have metal boards that serve as the base member, and plating layer formed on the surface of the metal board.

Metal Board

The metal board is patterned in the desired shape by etching, pressing, punching, blasting, or another such working method. The metal board is worked so as to have a plurality of patterns so that a plurality of light emitting devices can be obtained with a lead frame. Each pattern includes parts that function as heat dissipation portions or the like, or a pair of positive and negative leads that function as electrode terminals when used as a light emitting device, and furthermore there are linking portions for linking the various patterns, other parts, etc. There may also be cut-off portions, recesses, holes, or the like. This working can be performed before or after the plating, but is preferably performed before plating.

Examples of the material of the metal board include iron, nickel, copper, aluminum, and other such metals and alloys of these. A single layer may be used, or a multi-layer structure (such as a clad material) can be used. It is preferable to use iron or copper as the main component, and particularly preferable to use copper. Also, silicon, phosphorus, and other such non-metals may be contained as trace elements. The "main component" means an element which is 90% by weight or more with respect to total weight of the metal board.

The thickness of the metal board is preferably, for example, about 100 to 1000 μm and more preferably about 200 to 500 μm. The entire metal board may have this thickness, or part of it may be thinner. In particular, the portion that becomes the edge in patterning may have a shape that includes a depressed portion on the lower surface side of the lateral side surface, or in other words, a shape that includes a protruding portion on the upper surface side of the lateral side surface. The thickness of this protruding portion can be about one-half to one-fifth the thickness of the other portions, such as directly under the light emitting element. Using a shape such as this improves adhesion between the lead and the molded resin when a package has been formed. Also, in the case where the lead is disposed so as to be exposed on the lower surface of the package, this protruding portion or depressed portion provided to the edge of the lead will provide an anchoring effect that prevents the lead from coming loose from the molded resin.

Plating Layer

The first plating layer is provided to the upper surface of the metal board. The first plating layer contains nickel (Ni), gold (Au), and silver (Ag). The second plating layer is provided to the lower surface of the metal board. The second plating layer contain neither nickel nor gold.

A degreasing process is preferably provided to remove organic substances from the lead surface, as a pretreatment prior to forming the first and second plating layer. Furthermore, lead surface activation is preferably performed by acid treatment or the like following the degreasing step.

First Plating Layer

The first plating layer contains nickel (Ni), gold (Au), and silver (Ag). Preferably, it also contains palladium (Pd). As a multi-layer structure, stacking in the order of metal board/Ni/Au/Ag or metal board/Ni/Pd/Au/Ag is preferable.

Also, the first plating layer may be provided to the lateral side surfaces of the metal board. For example, the first plating layer is formed continuously with the upper surface and lateral side surfaces of the metal board by cover the entire lower surface of the patterned metal board with a resist, and dipping in a plating bath.

The first plating layer formed continuously with the upper surface and lateral side surfaces of the metal board allows corrosion of the base metal to be moderated in the first plating layer on the upper surface of the metal board, compared with the first plating layer formed only on the upper surface of the metal board.

In the case of including the protruding portion on the upper surface side of the lateral side surface of the metal board, the first plating layer is preferably formed on the lateral side surfaces and a lower surface of the protruding portion. Further, the first plating layer is preferably formed on the lateral side surfaces of the depressed portion of the metal board which is located under the protruding portion on the lateral side surface of the metal board.

The lead has an exposed portion on the lateral side surface of the light emitting device. In the case that the each light emitting device is formed by separating an array of the light emitting devices, the lateral side surfaces are formed from the separation surfaces. That is, the lateral side surfaces of the light emitting device are formed from a separation face of the molded resin and a separation face of the lead. The plating layer is formed before the molded resin is formed, in other words, the plating layer is formed on each lead in the state of the leadframe. Therefore, the lateral side surfaces of the lead which are formed by separating of the array of the light emitting devices, in other words, the side surfaces which are exposed on the lateral side surfaces of the light emitting device, are not covered by the plating layer. The plating layer is formed so as to surround the metal board at the lateral side surfaces of the metal board. The exposed plating layer here is the first plating layer, and contains nickel. Since nickel is harder than the metal board of copper, the separation portion of the first plating layer containing nickel allows burr of copper to be reduced.

Second Plating Layer

The second plating layer contain no nickel or gold, and preferably it does not contain palladium, either. In the present specification, the no nickel or gold here is defined to mean that no nickel or gold is intentionally used or added when forming the second plating layer; however, there is a room for a possible presence of impurities that might contain nickel or gold. These metals function as an underlayer for forming the highly reflective silver plating layer, so the cost entailed by plating layer can be kept low by excluding them from the plating layer formed on the lower surface side where light from the light emitting element is not applied. Also, heat dissipation can be improved because these metals are not contained. That is, the second plating layer does not contain nickel and gold Examples of the second plating layer include copper, aluminum, and silver. In the case where the second plating layer has silver layer, it can be integrated with the silver layer in the first plating layer. The second plating layer may be a single layer or multi layers of two or more layers. For instance, in the case the second plating layer is a single silver layer and the metal board is formed from copper, the silver contacts directly to copper.

In the case where silver plating is performed without first removing the resist, it may be difficult to form a plating layer with high reflectivity, so when the resist formed on the lower surface of the lead is removed before performing the silver plating layer on the upper surface side of the lead, then silver plating layer is also formed on the lower surface. That is, the silver plating layer is formed over all of the upper surface, the lateral side surfaces, and the lower surface of the metal board. Thus, the first plating layer and second plating layer may be integrally provided so that some of the plating layer (silver in this case) is shared.

The lower surface of the lead need not be plated, i.e., the plating layer is not formed on the lower surface of the lead.

Also, additional plating may be performed (for forming third plating layer) after the molded resin has been formed. A plating layer (solder plating layer) that contains lead, tin, silver, copper, bismuth, or the like, for example, may be formed as this third plating layer. In the case where plating layer is thus formed after molding, the lower surface of the lead will have a shape that protrudes more than the lower surface of the molded resin, and stable joint strength can be maintained during secondary mounting. Also, since the plating layer is formed after molding, it can be formed only where needed, which reduces the amount of material used.

The total thicknesses of the first plating layer and second plating layer is preferably about 1 to 10 μm, and more preferably 1.5 to 6 μm, respectively. The thickness of each layer can be suitably selected as dictated by the intended application. For instance, the thickness of the nickel layer may be about 0.5 to 5 μm, palladium about 0.005 to 0.05 μm, gold about 0.001 to 0.5 μm, and silver about 1 to 5 μm.

Molded Resin

The molded resin functions as a holding member that integrally holds two leads in producing a light emitting device, and also functions as a member that controls optical characteristics, such as optical reflectivity and light blocking.

The molded resin is provided between a pair of leads, and also functions as an insulating member that keeps the positive and negative leads from coming into contact with each other.

Examples of the resin material used for the molded resin include thermosetting resins, thermoplastic resins, and other such resins. Specific Examples of the thermosetting resin include an epoxy resin composition; a silicone resin composition; a modified epoxy resin composition, a modified silicone resin composition, a silicone modified epoxy resin; an epoxy modified silicone resin; a polyimide resin composition, a modified polyimide resin composition, an unsaturated polyester resin composition, diallyl phthalate and specific examples of the thermoplastic resin include a polyamide, a polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin). These may be used singly, or a combination of two or more types may be used. A thermosetting resin is particularly preferable. It is especially preferable for the molded resin to be one whose reflectivity with respect to the light from the light emitting element is at least 60% more preferably 70%, 80%, or 90% or more when used for a light emitting device.

The molded resin may also contain titanium oxide or another such light reflecting material. Examples of the reflecting material include titanium oxide, silicon oxide, zirconium oxide, potassium titanate, alumina, aluminum nitride, zinc oxide, boron nitride and mullite. This allows the light from the light emitting element to be reflected efficiently. It may also contain carbon black or another such black-color material. The light reflecting material or black-color material can be suitably adjusted according to the molding conditions such as resin molding method or resin fluidity, or according to the reflectivity, mechanical strength, or other such characteristics. For instance, when titanium oxide is used, it is preferably contained in an amount of between 10 and 40 wt %, and more preferably between 15 and 35 wt %, with respect to the total weight of the molded resin.

Light Emitting Element

The light emitting element comprises a semiconductor layer including a light emitting layer, stacked on an element substrate. Alternatively, it may comprise a semiconductor layer obtained by removing the substrate after stacking a semiconductor layer that includes a light emitting layer on an element substrate.

There are no particular restrictions on the element substrate, but an example is one that is normally used to grow a nitride semiconductor layer. A light-transmissive substrate is particularly preferable. The term light-transmissive here refers to a property of being able to transmit at least about 60%, 65%, 70% or 80% of the light emitted from the light emitting element. Example thereof include sapphire, spinel, NGO, $LiAlO_2$, $LiGaO_3$ and GaN. An element substrate composed of an oxide is particularly preferable, an element substrate composed of a wurtzite type crystal is more preferable, and sapphire is still more preferable.

The semiconductor layer stacked on the element substrate preferably has at least a light emitting structure. More specifically, the semiconductor layer comprise, for example, such that a first semiconductor layer (i.e., n-type or p-type semiconductor layer, a light emitting layer, optionally via a buffer layer or other such layer or layers, and a second semiconductor layer (i.e., p-type or n-type semiconductor layer are stacked in that order on a substrate, optionally via a buffer layer or other such layer or layers.

In this semiconductor layer, part of region is removed in the thickness direction from the second semiconductor layer side, that is, the layer is partially removed, the first semiconductor layer is exposed from there, and the light emitting layer and the second semiconductor layer are stacked in that order on the other region of the first semiconductor layer besides this exposed region.

There are no particular restrictions on the first semiconductor layer, light emitting layer, and second semiconductor layer that make up the semiconductor layer, but a nitride compound semiconductor such as $In_xAl_yGa_{1-x-y}N$ ($0 \leq X$, $0 \leq Y$, $X+Y \leq 1$) can be used to advantage, for example. The nitride semiconductor layer may be a single-layer structure, or it may be a multi-layer structure having layers of different composition, thickness, and so forth, a super-lattice structure, or the like. It is particularly favorable for the light emitting layer to have a single quantum well or a multiple quantum well structure in which thin-films with a quantum effect are stacked.

A pair of electrodes had by the light emitting element are disposed on the same surface side of the semiconductor layer. These electrodes may have a single-layer structure or a multi-layer structure, so long as they are ohmically connected so that the current-voltage characteristics are linear or substantially linear. These electrodes can be formed in the desired thickness, with any configuration and materials that are known in this field. For example, the thickness is preferably between a few dozen microns and 300 μm.

In particular, in the case where the pair of electrodes of the light emitting element are each electrically connected to leads via a joining member, it is preferable to dispose a reflective layer (a plating layer or DBRs) as the layer of the electrodes closest to the semiconductor layer side.

Also, the light emitting element may be a white light emitting element in which a phosphor layer has been formed in advance, or a white light emitting element in which a phosphor layer has been formed on the upper surface by covering the lateral side surfaces of the light emitting element with a resin or with a metal or another such reflective layer. Furthermore, a light emitting element can be used in which the thickness of the electrodes disposed on the mounting surface from the light emitting element is increased, and a resin (e.g., white resin) or other such stress moderation layer is provided around the periphery thereof.

Joining Members

The pair of electrodes of the light emitting element are electrically connected to the leads via a wire or a joining member.

As the joining member, an insulating joining member or a conductive joining member can be used, for example. A resin is an example of an insulating joining member, which can be a light transmissive resin, a white resin, or the like. Examples of conductive joining members include eutectic materials such as those based on alloys whose main components are gold and tin, alloys whose main components are gold and silicone, alloys whose main components are gold and germanium, and solder such as those based on alloys whose main components are silver, copper and tin, those based on alloys whose main components are copper and tin, those based on alloys whose main components are bismuth and tin. Of these, a eutectic alloy of Au—Sn is preferable. When an Au—Sn eutectic alloy is used, there is less degradation caused by thermal compression bonding on the electrodes of the light emitting element, and they can be joined more securely to the leads.

Sealing Members

The sealing members are used to protect the light emitting element, a protective element, a wire, or other such electronic parts mounted in the package against dust, moisture, external force, and the like. The material of the sealing member is preferably transmissive enough to transmit the light from the light emitting element, and is light resistant enough not to be readily degraded by the light. Specific examples of materials include silicone resin compositions, modified silicone resin compositions, epoxy resin compositions, modified epoxy resin compositions, acrylic resin compositions, and other such insulating resin compositions that are transmissive enough to transmit the light from the light emitting element. It is also possible to use a silicone resin, an epoxy resin, a urea resin, a fluororesin, a hybrid resin that includes one or more of these resins, or the like. Furthermore, the sealing member is not limited to being one of these organic substances, and can instead be glass, a silica sol, or another such inorganic material. In addition to these materials, a colorant, a light diffusing agent, a light reflecting material, any of various fillers, a wavelength conversion member (e.g., fluorescent member), or the like can also be contained as desired. The sealing member may be used in an amount large enough to cover the above-mentioned electronic parts.

The shape of the outer surface of the sealing member can be variously selected according to the light distribution characteristics and so forth. Directional characteristics can be adjusted by giving the upper surface a convex lens shape, a concave lens shape, a Fresnel lens shape, or the like, for example. Also, a lens member may be provided in addition to the sealing member. Furthermore, in the case where a phosphor-containing molded article (such as a phosphor-containing flat molded article, or a phosphor-containing dome-shaped molded article) is used, it is preferable to select a material with excellent adhesion to the phosphor-containing molded article as the sealing member. Besides a resin composition, glass or another such inorganic substance can be used as the phosphor-containing molded article.

Examples of phosphors include oxide-based phosphor, sulfide-based phosphor, and nitride-based phosphor. For instance, when a gallium nitride light emitting element that emits blue light is used as the light emitting element, examples include LAG materials and YAG materials that absorb blue light and emit yellow to green light, SiAlON (β-SiAlON) materials that emit green light, SCASN materials, CASN materials, KSF-based phosphors ($K_2SiF_6$:Mn), and sulfide-based phosphors that emit red light, and other such phosphors, which can be used singly or in combination.

The light emitting device may further have a Zener diode, a bridge diode, or another such protective element.

Embodiment 1

Figure 1B:
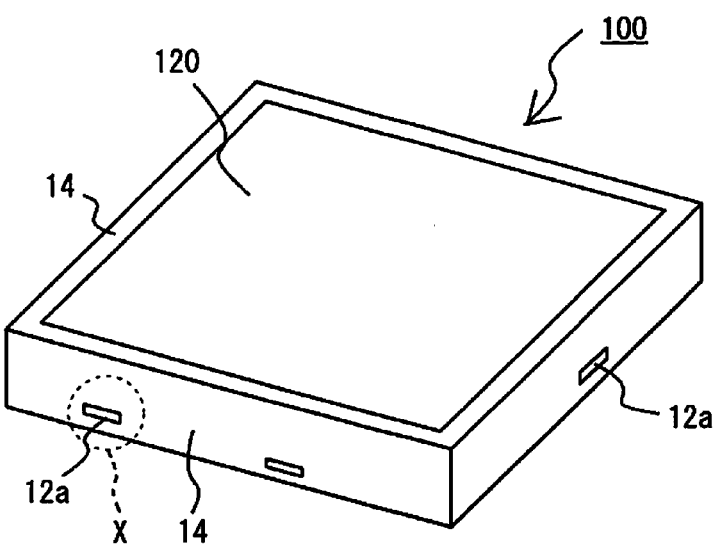
FIG. 1B is a schematic perspective view of the light emitting device of FIG. 1A.
Figure 1C:
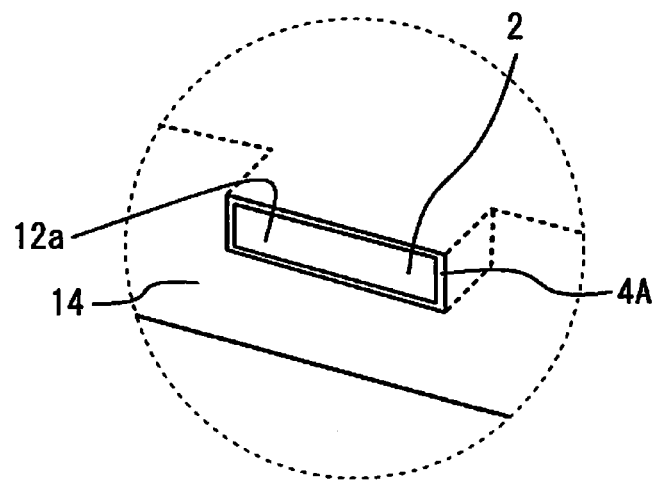
FIG. 1C is an enlarged view of X in FIG. 1B.

FIG. 1 is a schematic cross sectional view of a light emitting device 100 according to Embodiment 1., FIG. 1B is a schematic perspective view of the light emitting device of FIG. 1A, and FIG. 1C is an enlarged view of X in FIG. 1B. The light emitting device 100 includes a package 10 equipped with a recessed portion, a light emitting element 140 mounted on the bottom surface of the recessed portion of the package 10, and a sealing member 120 that fills the recessed portion so as to cover the light emitting element 140. The light emitting element 140 is electrically connected to leads 12 via wires 160. The package 10 comprises two leads 12 that become a pair of positive and negative electrodes, and a molded resin 14 that holds the leads 12 and has a bottom surface and lateral side surfaces. Parts of the upper surfaces of the leads 12 are exposed at the bottom surface of the recessed portion, and substantially all of the lower surfaces are exposed and disposed so as to become the lower surface of the light emitting device 100. The leads 12 has an exposed portion 12a which is exposed on the lateral side surface of the light emitting device as shown in FIG. 1B.

The each lead 12 includes a metal board 2 (as the base member of the lead) and plating layer 4 that is formed on the surface of the metal board 2. The plating layer 4 has first plating layer 4A provided to the upper surface of the lead, and second plating layer 4B provided to the lower surface of the lead. The first plating layer 4A is configured of nickel, gold, and silver, stacked in that order. The second plating layer 4B includes silver layer, but does not include either nickel layer or gold layer. The exposed portions 12a, which are exposed on the lateral side surfaces of the light emitting device, is formed such that the first plating layer 4A surrounds the surface of the metal board 2 as shown in FIG. 1C.

This configuration can realize a light emitting device in which a decrease in the reflectivity of the leads is moderated while the cost is kept low. Further, the plating layer containing nickel at a portion in which the exposed lead is separated allows burr of the metal board 2 to be reduced.

Embodiment 2

Figure 2:
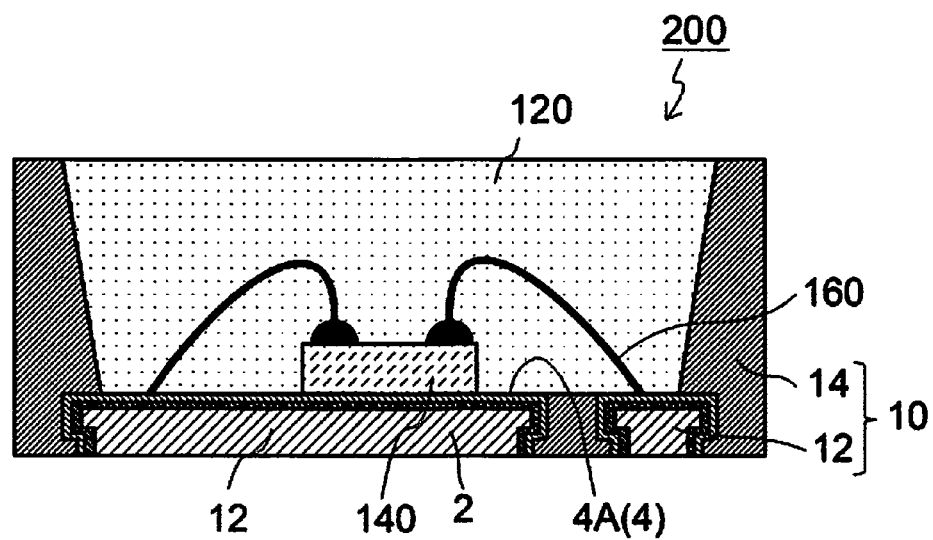
FIG. 2 is a schematic cross sectional view illustrating a light emitting device according to an embodiment.

FIG. 2 is a schematic cross sectional view of a light emitting device 200 according to Embodiment 2. Embodiment 2 differs from Embodiment 1 in that there is no plating layer on the lower surface of the metal board. Substantially the entire lower surface of the each lead 12 is exposed and becomes the lower surface of the light emitting device, and without being plated, the metal board 2 itself is exposed on the lower surface of the light emitting device. This configuration can realize a light emitting device in which a decrease in the reflectivity of the leads is moderated while the cost is kept low.

Embodiment 3

Figure 3:
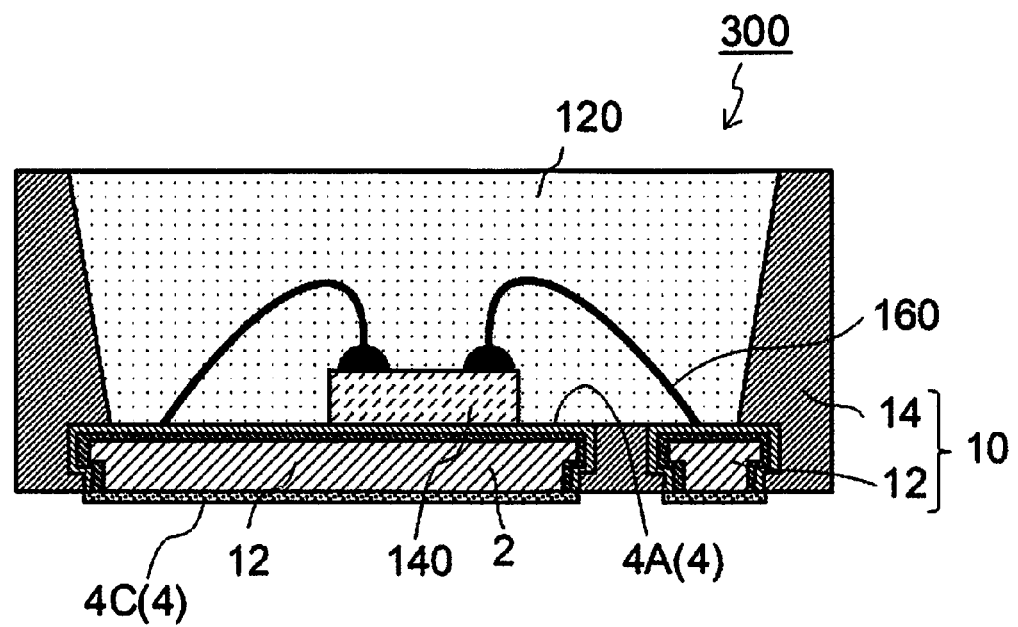
FIG. 3 is a schematic cross sectional view illustrating a light emitting device according to an embodiment.

FIG. 3 is a schematic cross sectional view illustrating a light emitting device 300 according to Embodiment 3. Embodiment 3 differs from Embodiment 2 in that there is third plating layer, which is plating layer formed after molding, on the lower surface of the metal board. The leads 12 have the third plating layer 4C formed on their lower surfaces, and the lower surface of the third plating layer 4C sticks out beyond the lower surface of the molded resin. The third plating layer contains tin, and its thickness is between about 0.1 and 100 μm.

INDUSTRIAL APPLICABILITY

The light source device of the present disclosure can be used in a variety of light sources, such as a lighting-use light source, various kinds of indicator-use light source, a light source installed in/on a vehicle, a display-use light source, a light source for a liquid crystal backlight, sensor-use light source, and signaling devices. Also, it is applicable to all the light-emitting device using leads such as a side-view type light emitting device.

What is claimed is:

1. A light emitting device, comprising:
a package equipped with
a lead that has an upper surface and a lower surface, and has a metal board and a plating layer formed on a surface of the metal board, the plating layer including a first plating layer provided to an upper surface and lateral side surfaces of the metal board, and a second plating layer provided to a lower surface of the metal board, the first plating layer containing a nickel plating layer, a gold plating layer and a silver plating layer, and the second plating layer containing a silver plating layer and containing neither nickel nor gold, the silver plating layer of the second plating layer being integrated with the silver plating layer of the first plating layer with the silver plating layer being an outermost layer in the first plating layer and an outermost layer in the second plating layer; and
a molded resin that holds the lead;
a light emitting element mounted in the package; and
a sealing member that seals the light emitting element.

2. The light emitting device according to claim 1, wherein the first plating layer includes a palladium plating layer.

3. The light emitting device according to claim 1, wherein the first plating layer containing the nickel plating layer, a palladium plating layer, the gold plating layer and the silver plating layer formed on the metal board in this order.

4. The light emitting device according to claim 1, wherein the second plating layer contains only the silver plating layer.

5. The light emitting device according to claim 1, wherein a lower end of the first plating layer is substantially flush with the lower surface of the metal board.

6. The light emitting device according to claim 1, wherein the lead includes a protruding portion on an upper surface side of each of the lateral side surfaces.

7. The light emitting device according to claim 6, wherein a thickness of the protruding portion in a thickness direction of the lead is about one-half to one-fifth of a maximum thickness of the lead.

8. The light emitting device according to claim 6, wherein the first plating layer is provided to a lower surface of the protruding portion.

9. The light emitting device according to claim 1, wherein the lead includes an exposed portion exposed at a lateral side surface of the light emitting device.

10. The light emitting device according to claim 9, wherein
the first plating layer is arranged in an outer periphery of the exposed portion.

11. The light emitting device according to claim 1, wherein
the lead further includes a third plating layer provided on a surface of the second plating layer at a lower surface of the lead.

12. The light emitting device according to claim 11, wherein
the lower surface of the lead protrudes more outwardly than a lower surface of the molded resin.

* * * * *